United States Patent
Desieres et al.

(10) Patent No.: US 7,838,839 B2
(45) Date of Patent: Nov. 23, 2010

(54) HYBRID MULTIBEAM ELECTRONIC EMISSION DEVICE WITH CONTROLLED DIVERGENCE

(75) Inventors: Yohan Desieres, Grenoble (FR); Pierre Nicolas, Saint-Egreve (FR); Charlotte Gillot, Voiron (FR); Serge Gidon, La Murette (FR); Jean-Luc Martin, Saint Geoire en Valdaine (FR)

(73) Assignee: Commissariat A l'Energie Atomique, Paris (FR)

( * ) Notice: Subject to any disclaimer, the term of this patent is extended or adjusted under 35 U.S.C. 154(b) by 1100 days.

(21) Appl. No.: 10/585,073

(22) PCT Filed: Dec. 29, 2004

(86) PCT No.: PCT/FR2004/003407

§ 371 (c)(1),
(2), (4) Date: Jun. 29, 2006

(87) PCT Pub. No.: WO2005/074001

PCT Pub. Date: Aug. 11, 2005

(65) Prior Publication Data

US 2007/0080647 A1 Apr. 12, 2007

(30) Foreign Application Priority Data

Dec. 30, 2003 (FR) ................................. 03 51228
Dec. 30, 2003 (FR) ................................. 03 51229

(51) Int. Cl.
*G21K 1/08* (2006.01)
(52) U.S. Cl. ................................. 250/396 R; 250/492.3
(58) Field of Classification Search ........................ None
See application file for complete search history.

(56) References Cited

U.S. PATENT DOCUMENTS

| | | | |
|---|---|---|---|
| 5,363,021 A | * | 11/1994 | MacDonald ................. 315/366 |
| 5,430,347 A | | 7/1995 | Kane et al. |
| 5,486,697 A | * | 1/1996 | Stalder et al. ............... 250/305 |
| 5,548,185 A | | 8/1996 | Kumar et al. |
| 5,962,859 A | * | 10/1999 | Groves et al. .......... 250/492.23 |
| 5,981,962 A | * | 11/1999 | Groves et al. .......... 250/492.23 |
| 6,175,122 B1 | * | 1/2001 | Groves et al. .......... 250/492.23 |
| 6,512,235 B1 | * | 1/2003 | Eitan et al. ................ 250/423 F |
| 6,617,595 B1 | * | 9/2003 | Okunuki ................. 250/492.22 |

(Continued)

FOREIGN PATENT DOCUMENTS

EP 0 780 879 6/1997

(Continued)

OTHER PUBLICATIONS

Cameron E. Presley, "FCA: A Critical Advantage for Designers", Advanced Packaging, Apr. 1999, pp. 38-42.

(Continued)

*Primary Examiner*—Bernard E Souw
*Assistant Examiner*—Andrew Smyth
(74) *Attorney, Agent, or Firm*—Oblon, Spivak, McClelland, Maier & Neustadt, L.L.P.

(57) ABSTRACT

An electronic emission device including plural electron beams including a first structure having a plurality of emission sources of electron beam, hybridized with a second structure including a plurality of diaphragm openings.

21 Claims, 12 Drawing Sheets

U.S. PATENT DOCUMENTS

| | | | |
|---|---|---|---|
| 6,872,950 B2 * | 3/2005 | Shimada et al. | 250/396 R |
| 2001/0052576 A1 * | 12/2001 | Shimada et al. | 250/492.1 |
| 2003/0209676 A1 | 11/2003 | Loschner et al. | |
| 2003/0218140 A1 * | 11/2003 | Tamamori et al. | 250/492.1 |
| 2005/0035300 A1 * | 2/2005 | Iwasaki et al. | 250/396 R |

FOREIGN PATENT DOCUMENTS

| | | |
|---|---|---|
| EP | 1 249 855 | 10/2002 |
| GB | 1 380 126 | 1/1975 |
| WO | 89 11157 | 11/1989 |

OTHER PUBLICATIONS

Baylor, L. R. et al.,"Digital Electrostatic Electron-Beam Array Lithography", J. Vac. Sci. Technol., vol. 20, No. 6, pp. 2646-2650, 2002.

T. H. P. Chang et al.,"Arrayed Miniature Electron Beam Columns for High Throughput Sub-100 NM Lithography", J. Vac. Sci. Technol., vol. 10, No. 6. pp. 2743-2748, 1992.

Barjon, J. et al.,"Simple Magnetic Focusing for an electron Gun Based on a Microtip Array", J. Vac. Sci. Technol., vol. 21, No. 3, pp. 989-995, 2003.

* cited by examiner

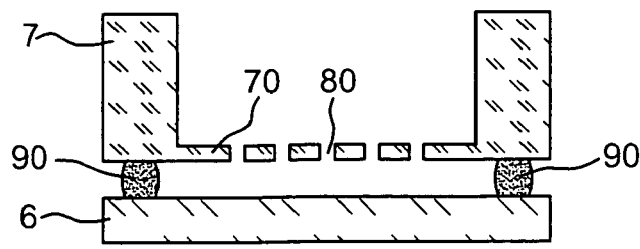
FIG 9
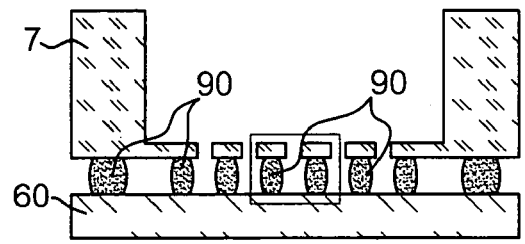
FIG 9'
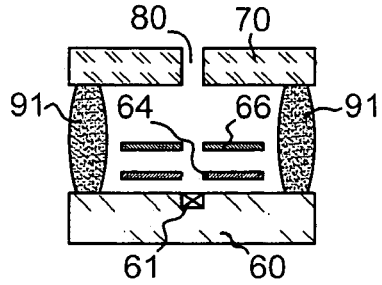
FIG 9'A
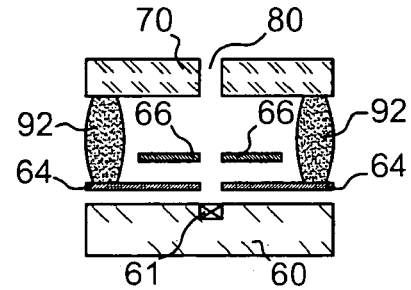
FIG 9'B
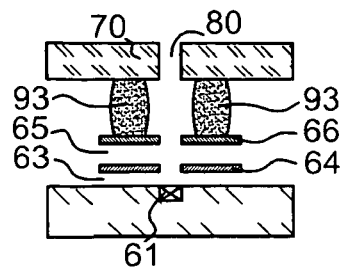
FIG 9'C

HYBRID MULTIBEAM ELECTRONIC EMISSION DEVICE WITH CONTROLLED DIVERGENCE

FIELD AND PRIOR ART

The present invention relates to electronic emission devices emitting electron beams, and more particularly a multibeam emission device comprising several electron emission sources capable of putting out several electron beams in parallel, with a system for focussing these electron beams.

In the industrial sector, the electronic emission devices are utilised as means for observation and microscopic analysis, better known as scanning electron microscopy (SEM), such as insulation and etching (lithography) means, especially in integrated circuit lithography, or as testing and measuring means, or again as writing or storage means.

In industrial applications, monosource electronic emission devices are still being used, which emit a single electron beam. Industrial applications are considerably limited by the utilisation of monosource devices offering only a small accessible field surface and a low etching/writing speed for integrated circuits inherent in the slow rate of electronic beam scanning.

In order to be free of such constraints, current development is leaning towards <<parallelisation>> of several sources, each scanning a less significant surface.

In the field of multibeam electronic emission devices, two distinct types of structures are known, the assembled structure and the monolithic structure.

The document entitled <<Arrayed miniature electron beam columns for high throughput sub-100 nm lithography>> written by T. H. P. Chang and D. P. Kern, published in the <<Journal of Vacuum Science Technology (American Vacuum Society)>>, volume B10(6), pages 2743 to 2748, publishing in November/December 1992, describes a multibeam electronic emission device 1 made up of individual miniature columns 10 having a structure assembled in a matrix, such as illustrated in FIG. 1A.

As detailed in FIG. 1B, each column 10 is made up of a point 12 with electron field emission, connected to an extraction grid 13, a diaphragm 14 and a series of Einzel microlenses 15, 16, 17 to focus the electron beam, and to a group of several lateral deflectors 18 for deflecting the beam in order to obtain a point of focus of electrons which scans a small surface on a substrate pellet 1000 corresponding to the integrated circuit chip 100 to be etched.

Each column comprises an assembly of electrostatic microlenses made of silicon, independently made by MEMS technology (in English <<Micro Electro Mechanical System>>). Each column further comprises a double retroaction system, on the one hand between the field emission point 12 and the scanning microscope 11 with tunnel effect, and on the other hand between the sample 1000 and the STM microscope to control and rectify the position of the emitting point 12 and the focus of the beam. A certain number of these individual independent columns 10 is combined and assembled in a checkered or mosaic layout 1 for etching in parallel a series of integrated circuits chips.

The drawback to such a structure is that no element is integrated, neither axially to the core of a column 10, nor at a transversal level between the adjacent columns 1. The density of emitters thus remains low and the writing time is long.

The matricial monolithic structures are able to integrate a greater number of emission sources of electron beams in a single device of given size and thus envisages vastly greater writing speeds. Typically, pitches de a few tens of microns can be obtained.

The document WO 89/11157 describes a multibeam electronic emission device with integrated matricial structure on a substrate. As illustrated in FIG. 2, each emitting source 21 of an electron beam 29 comprises only one electron emitting point 22 (cathode) and an annular grid 23 for extraction of electrons, the sources 21 being connected to a primitive focussing system formed by a metallic plate 24 to the rear of the resistive substrate 20 which generates field lines 25,25' projecting to the front of the substrate, except in front of the sources themselves.

The drawback of this focussing system is being placed in proximity and above all in a rear position relative to the emission sources of the electron beam. It actually does not comprise any adequate focussing optics arranged on the trajectory of the beam (neither electrode, nor focussing lens). It therefore cannot attain resolutions of less than 50 nm.

The document U.S. Pat. No. 5,430,347 describes an individual emission device of an electron beam intended for displaying images and made by depositing layers and depositing metallisation on a substrate illustrated in FIG. 3. The source comprises an emitting point, an annular grid and one or two focussing grids, a luminescent cathode screen being arranged opposite, in front of the source.

The document U.S. Pat. No. 5,430,347 announces resolution of an image point in the focal plane of a diameter of ten micrometers at a distance of one millimeter of focussing (spot from 10 μm to 1 mm).

Such resolution is quite insufficient for applications such as electronic microscopy or the production of integrated circuits, a field in which the aim is to obtain a resolution clearly less than a micrometer, of about few tens of nanometers, which is the order of magnitude of the patterns to be made.

The document entitled <<Digital Electrostatic Electron-Beam Array Lithography>> by L. R. Baylor et al. published in the <<Journal of Vacuum Science Technology>>, volume B20 (6), appearing in November/December 2002, describes a multibeam matrix structure for electron emission integrated on a silicon substrate and illustrated in FIGS. 3A and 3B.

Each beam emission site 31 of the matrix 30 comprises a localised source 32 formed by an emitting point made of nanometric carbon, in the axis of which is superposed a series of annular electrodes 33,34,35,36. The first electrode 33 is an extraction grid, whereof the function is to extract electrons from the emitting point 32 forming the cathode. The function of the following successive electrodes 34,35,36, subjected to potentials VE, VC, VA, is to focus the beam 39 of emitted electrons on an anode 38 facing the device. The resolution specified for this device is 50 nm in diameter at a focal distance W of 100 μm only.

The disadvantage of all these monolithic structures is that they require extremely advanced alignment control of etching of layers. In particular, the different successive levels of metallisation of electrodes 33,34,35,36 must be etched with openings and very precise alignment, one above the other, and this at a depth of 4 μm, particularly delicate in auto-aligned microelectronic technology.

Another problem, the depositing of each emitter 32 at the bottom of the cavity 31' formed by the stacking of the annular electrodes, can be solved only by depositing after the cavity is fully finished. The emitter must be precisely aligned and oriented according to the axis of the openings of the electrodes and also limited in height. Furthermore, this depositing must be controlled homogeneously for all the emitters of the matrix to provide homogeneous optical behaviour during focussing of each source, which creates major constraints on the depositing.

Furthermore, the field-effect emitters inherently have emission homogeneities between emitters (divergence of the beams varies from one source to the other). In the same way, the emission from each field-effect source exhibits instabilities over time, which are generally impossible to foresee and control. These inhomogeneities and instabilities will be resulted, in the case of the device presented by Baylor, in variation in the resolution of an emitter over time, as well as by inhomogeneity in resolution between the different emitters, which is incompatible with high-resolution applications. In fact, for this type of application, it is necessary to have a stable spot size over time, which is homogeneous between each source.

The object of the invention is thus to provide a programmable multibeam electronic emission device, compact without the abovementioned disadvantages and with stable optical resolution over time and homogeneous between the emitters.

In particular, an objective of the invention is to provide a set of sources of electron beams whereof the divergence is low and stable over time.

Another objective of the invention is to be able to utilise this device to form a set of electronic spots of nanometric dimension.

EXPLANATION OF THE INVENTION

To solve these problems, the invention provides hybridising a diaphragm structure, or means forming a diaphragm, a structure comprising a plurality of emission sources of electron beams or means forming an electron emission source. On the one hand, this contributes an improvement to the problem of resolution limitation connected to the excessive divergence of each emitting source, and, on the other hand, a solution to the problems of instability and inhomogeneity of emitting sources or angular openings over time and from one source to the other.

The hybridisation device aligns and separates, at a given distance, the diaphragm structure relative to the structure of electron emission sources.

On the other hand, the invention ensures that the diaphragm structure simultaneously acts as an electrostatic focussing system. This means that each diaphragm opening is polarised and shaped to form an electrostatic lens.

In addition, the invention provides utilising this hybridised emission source in a magnetic focussing system known here as magnetic or electrostatic or electromagnetic projection optics.

The invention thus provides hybridising a diaphragm electrode structure on a structure of matrix base of emitters implanted in a substrate. The electrode structure especially acts as a diaphragm for each electron beam emitted by each corresponding source with field effect.

According to one embodiment, the matrix emitter structure can be a simple base structure, not comprising a focussing system, that is, without an integrated focussing level in the substrate. The invention applies in particular to matrix emitter structures in which the emission sources are arranged according to a network with micrometric steps, that is, with a space between sources of about one micrometer to one millimeter.

Making the matrix emitter structure is advantageously greatly simplified according to the invention.

The invention is made with an electronic emission device having several electron beams, comprising a first structure, or first means, comprising a plurality of emission sources of electron beams hybridised with a second structure, or second means, comprising a plurality of diaphragm openings.

According to the invention the second structure is formed by an electrode or a membrane, metallic or conductive.

According to the invention, hybridisation between the first structure of emission of electron beams and the second structure of diaphragm electrode is carried out by interposition of metallic balls, especially balls made of an alloy of fusible metals or balls made of gold.

Alternatively, hybridisation between the first and the second structure can be carried out by the interposition of one or more anisotropic conduction films.

Preferably, the first structure comprises a periodic arrangement of electron emission sources, the first structure having for example a matricial arrangement or a multilinear arrangement or a linear arrangement; the arrangement can be periodic and regular or irregular.

Similarly, the second structure preferably has a periodic arrangement of the diaphragm openings, the second structure for example having a matricial arrangement or a multilinear arrangement or a linear arrangement, periodic and regular or irregular. This arrangement can be similar to that of the first structure or different according to the application.

It is provided that at least one side of the electrode diaphragm structure is dipped in an electric acceleration field of electrons.

The device according to the invention can also comprise an electrostatic and/or magnetic focussing system arranged outside the second structure, that is, after the hybridisation interval between the first emission structure having electron beams and the second diaphragm structure opening. Advantageously, the device will be able to bathe in a uniform magnetic field resulting from a magnetic projection device.

The first emission source structure can also comprise an electrostatic collimation system of electrodes participating in focussing and arranged above each emission source implanted on the substrate.

According to the invention it is provided that the second electrode diaphragm structure is subjected to potential polarisation and thus contributes to the focussing process of the beams.

According to a refined embodiment, the second diaphragm electrode structure has asymmetrical diaphragm openings on one side relative to the other side of the wall formed by the diaphragm.

According to one embodiment, each diaphragm opening comprises bevelled opening edges, for example in a flat bevel, or opening edges concave in shape or again opening edges convex in shape. It is provided especially that each opening, or at least one diaphragm opening, has a bigger opening surface on one side of the diaphragm relative to the opening surface opposite the other side of the diaphragm. By way of advantage in this case, it is provided that the diaphragm openings are oriented such that the largest surface opening is facing an electric field of greater value than the smallest surface opening.

According to another embodiment, the second structure comprises two levels of electrodes or two levels of distinct metallic or conductive membranes separated by an insulating material or dielectric layers, so as to independently control the electric field at the diaphragm input and output.

According to another embodiment, it is provided that each opening of the electrode structure undergoes electrical polarisation different to the other openings, the openings being arranged in portions of conductive or metallic membrane, separated from one another by insulating parts.

According to another embodiment, the first structure comprises a substrate, a cathode, electron emitter means, an extraction grid, and in which the second structure forms current collection means, insulated from the extraction grid and arranged so as to collect part of the current emitted by the emitter means, means for measuring the collected current, and control means, as a function of measuring the collected current, the current emitted by the electron emitter means.

Advantageously, the electron emitter means comprise at least one micro-point or a nanotube.

According to one embodiment, the current control means emitted by the electron emitter means comprise pulsed polarisation means of the extraction grid.

According to another embodiment, the current control means emitted by the electron emitter means comprise pulsed polarisation means of the cathode.

Advantageously, the substrate is a CMOS substrate.

According to a particular embodiment, electrical crossings connect the collection means and the extraction grid to the CMOS substrate.

According to another particular form, the collection means are connected by electrical and mechanical interconnection means formed by the balls or a pillar to a zone conductive.

Advantageously, the current-measuring means are located in the substrate.

It can also be provided that the current-measuring means are made on a substrate on which the collection means are located.

Advantageously, the current-measuring means comprise an amplifier on which a condenser or a resistor is mounted in counter-reaction and in particular, the current-measuring means comprise a measuring setup by current mirror.

Preferably, the openings are circular or comprise circular sectors.

BRIEF EXPLANATION OF THE DIAGRAMS

Other characteristics, objectives and advantages of the invention will appear from the following description of embodiments of the invention, given by way of non-limiting example, with respect to the attached diagrams, in which:

FIG. 9 illustrates details of an embodiment of a hybridisation system between the diaphragm structure and the structure for emission of electron beams of the device, according to the invention;

Figure 10:
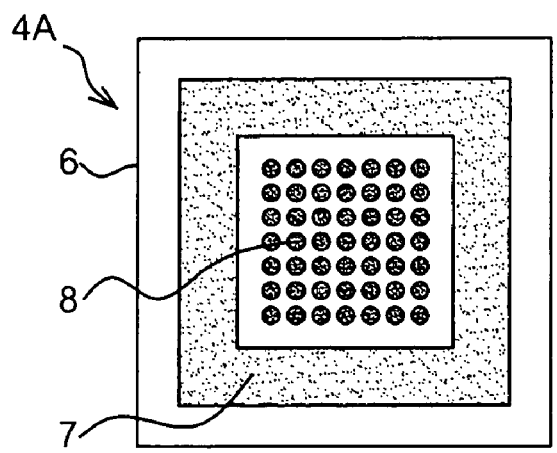
Figure 11:
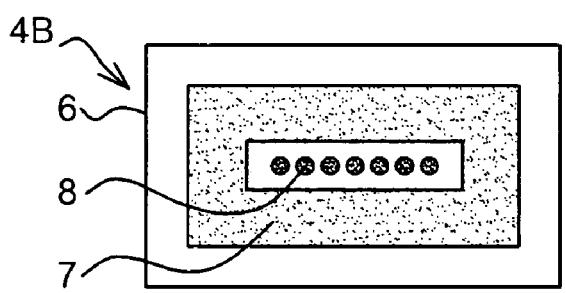
Figure 12:
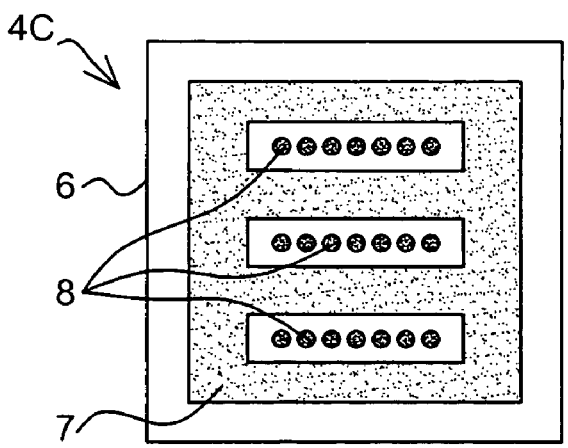

FIG. 9' illustrates another embodiment of the hybridisation system of the device, according to the invention, the views 9'A, 9'B and 9'C showing alternative embodiments of the hybridisation system as a function of the structure of the emission matrix;

FIGS. 10, 11 and 12 illustrate general views of devices comprising an emission source structure hybridised with a diaphragm opening structure, according to the invention, arranged according to a bidimensional matrix arrangement, a linear arrangement and a multilinear arrangement;

FIGS. 13a to 16B illustrate an embodiment of the device.

DETAILED EXPLANATION OF EMBODIMENTS OF THE INVENTION

Figure 1A:
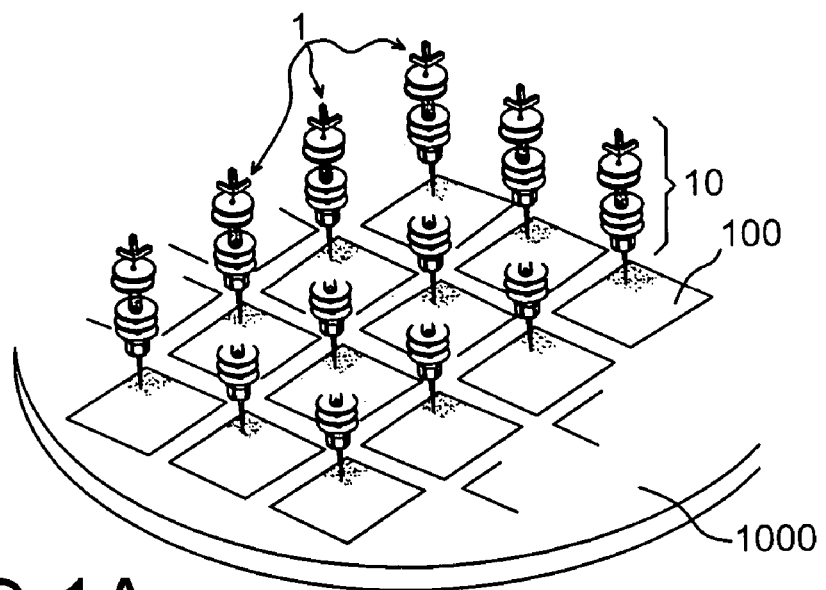
FIGS. 1A and 1B illustrate a multibeam electronic emission device with matrix structure, composed of several individual miniature columns assembled beside one another, according to the prior art.
Figure 1B:
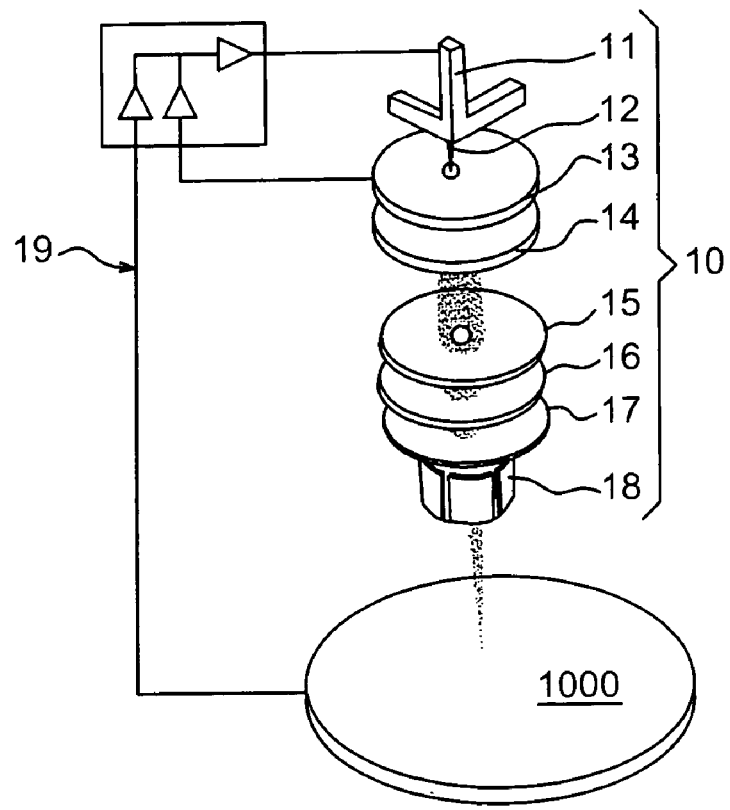
Figure 2:
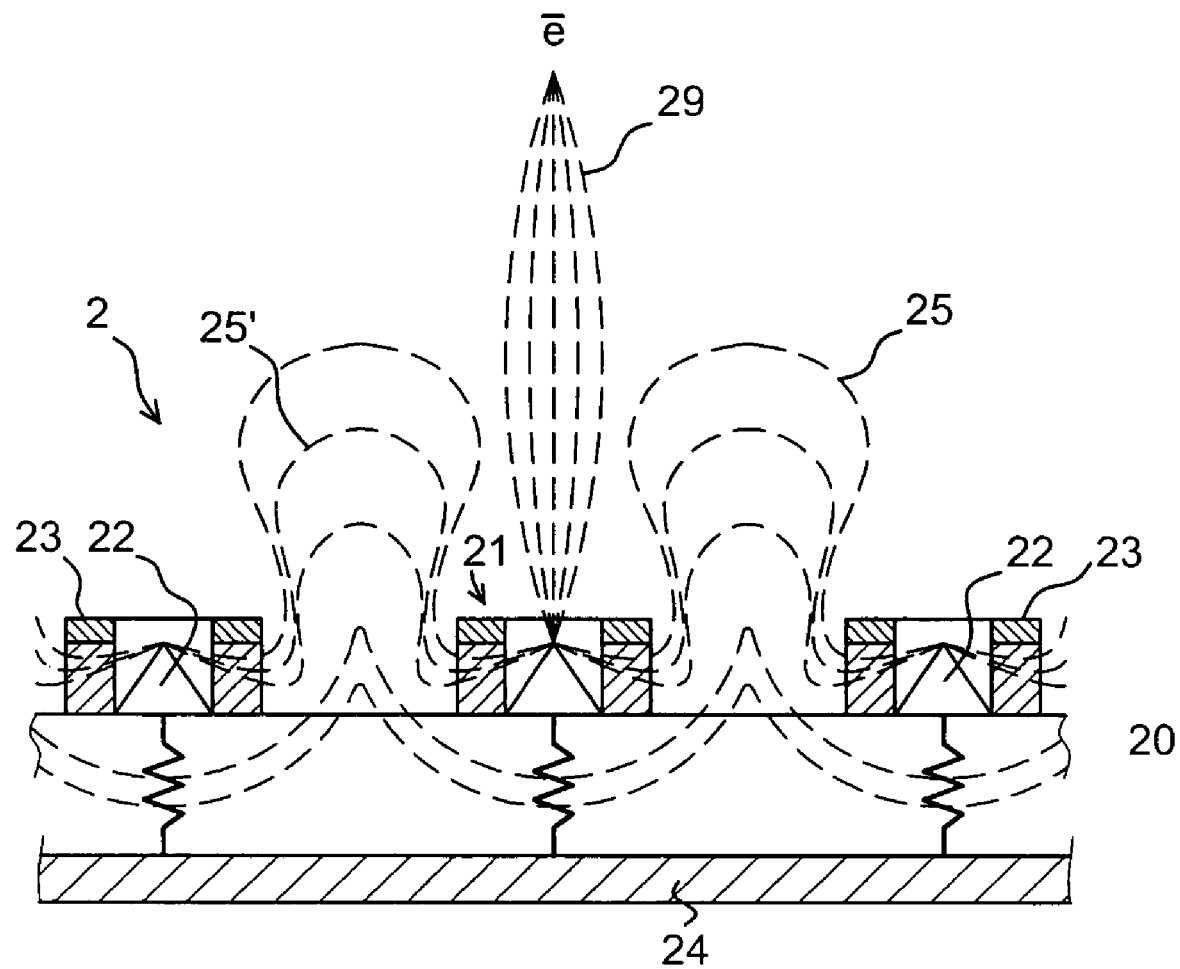
FIG. 2 illustrates a multibeam electronic emission device with matrix structure integrated on a substrate, with a primary focussing system to the rear of the substrate, according to the prior art.
Figure 3A:
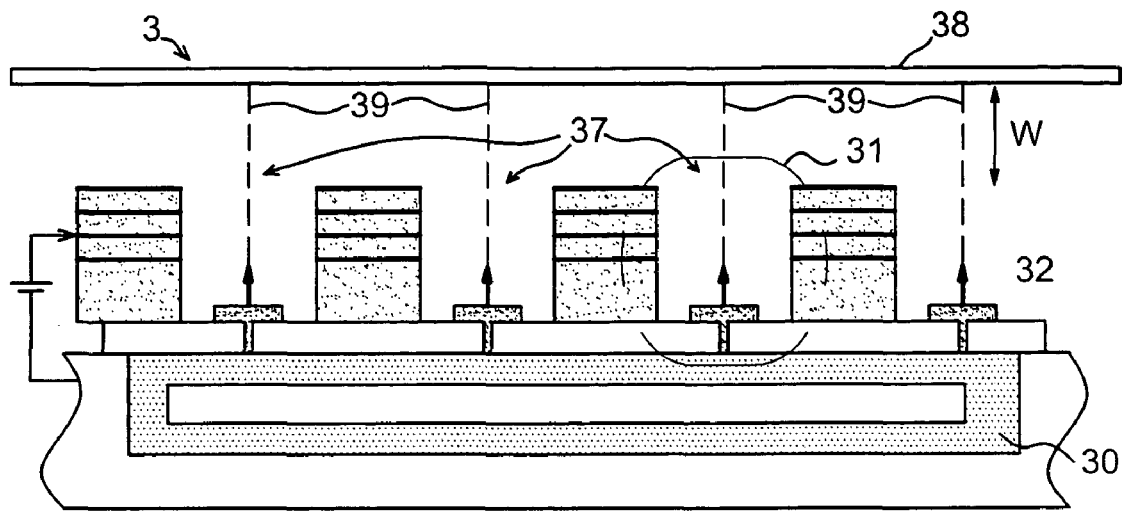
FIGS. 3A and 3B illustrate a multibeam electronic emission device with integrated structure on a substrate comprising several levels of focussing electrodes above each source, according to the prior art.
Figure 3B:
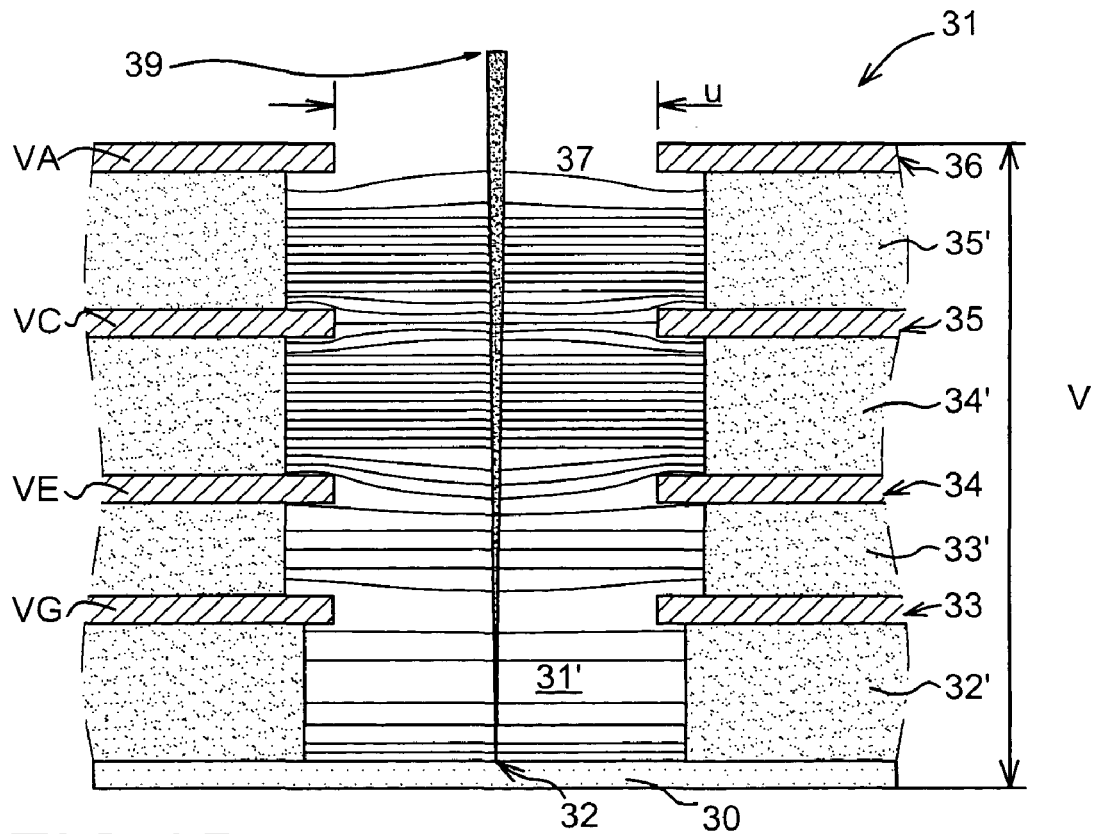
Figure 4:
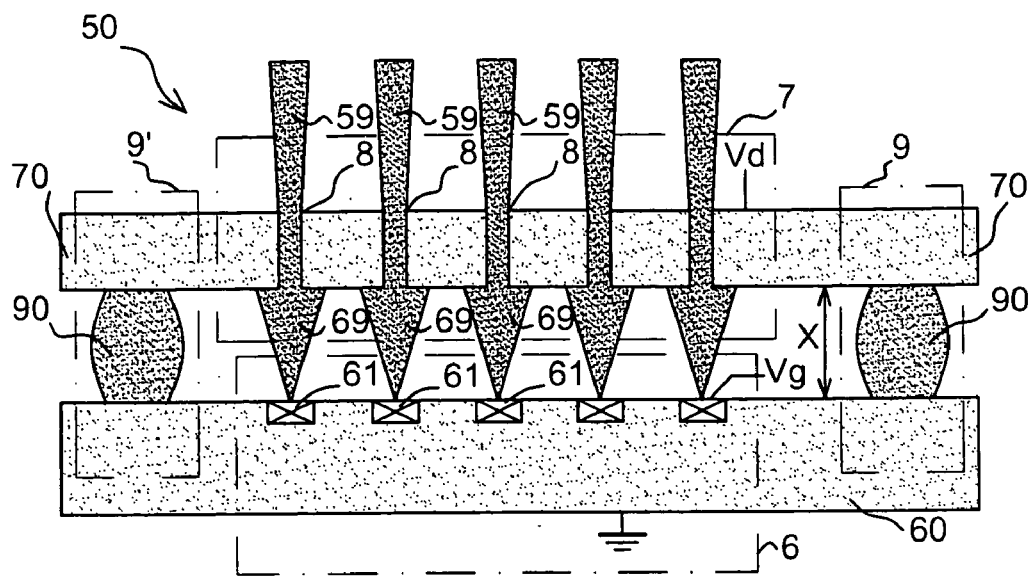
FIG. 4 illustrates a display diagram of the structure of a programmable hybrid multibeam electronic emission device, according to the invention.
Figure 5:
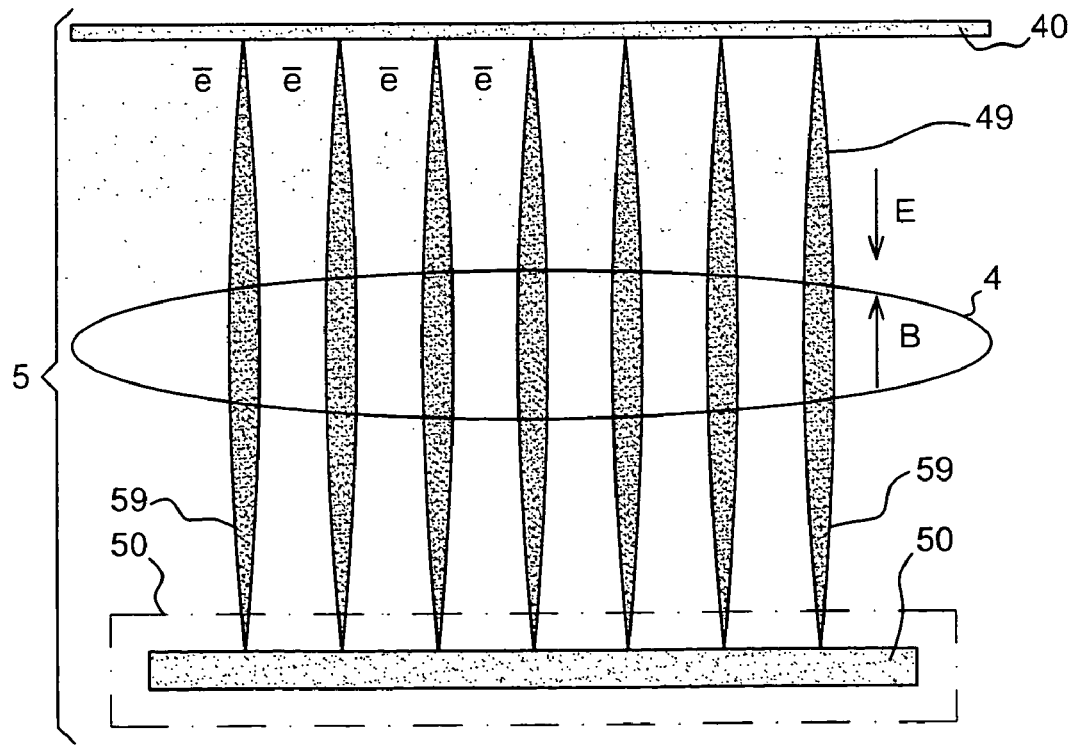
FIG. 5 illustrates a general view of a programmable hybrid multibeam electronic emission device, coupled to an electromagnetic focussing system and an electrostatic acceleration anode, according to the invention.

FIGS. 4 and 5 show the general architecture of the electronic emission device used by the invention.

According to the general view of a complete device illustrated by FIG. 5, the electronic emission device according to the invention can especially be implemented within a global high-resolution multibeam electronic emission system 5 which comprises an anode 40 and a focussing system 4, here known as <<focussing optic>>.

The focussing optic 4 is designed to focus each electron beam 59 emitted by a localised source with field effect, in the form of an electronic spot, that is, a localised image concentrated in the focal plane, embodied here by the anode 40, which can be also a screen or a sample, or it could be a microscopic sample to be observed or a semiconductor substrate (<<wafer>>) covered with resin to be isolated. The anode 40 acts to accelerate the electron beams.

The focussing optic 4 can be a magnetic projection system, or a system combining electrostatic and/or magnetic lenses. In the case of magnetic projection, the focussing optic 4 is distributed over the entire device.

FIG. 4 illustrates the architecture of the electronic emission device 50 itself, according to the invention.

The device, according to the invention, comprises a first structure 6 formed for example by a semiconductive substrate plate 60, for example made of silicon, on which an addressing circuit is implanted, in CMOS technology for example, and comprising a plurality of sources 61 for emission of electron beams, arranged in matrix form or at least according to a periodic regular, or irregular, arrangement.

The device 50 according to the invention comprises on the other hand a second structure 7 formed by an electrode structure 70 comprising a plurality of diaphragm openings 8 also arranged according to a matrix arrangement or at least according to a periodic regular, or irregular, arrangement, and which advantageously corresponds to the arrangement of the emission sources of the first structure 6.

According to the invention, the substrate plate 60 comprising the plurality of emission source with field effect 61 forming the base structure 6 is hybridised with the structured electrode 70 comprising the plurality of diaphragm openings 8 and forming the second structure 7, by means of a hybridisation system 9-9'.

The second structure 7 comprising diaphragm openings 8, is preferably made of a metallic electrode or a conductive membrane 70. In general, part or the totality of the second structure 7 is conductive to be able to evacuate the electronic charges transferred by the electrons whereof propagation is interrupted by the diaphragm 70.

According to the embodiment illustrated in FIG. 4, the hybridisation system 9 is composed of hybridisation balls 90 made advantageously of metal or fusible metallic alloy and spherical or oblong in shape, in the shape of a plug or mushroom, for example.

The hybridisation system 9, 9' advantageously positions horizontally and vertically the structure 7 on the structure 6. The spread distance X between these two structures is defined by the size of the hybridisation balls 90. It can be selected from a very extended range of value from about a micrometer to about a millimeter.

As illustrated in FIG. 4, the advantage of the invention is that each opening 8 transmits only one emerging electron beam 59 of reduced divergence, relative to the initial divergence of the electron beam 69 originating from the emitting source 61. This divergence becomes particularly independent of the instabilities of the sources and the emission inhomogeneities of the sources.

According to the diagram of FIG. 4, the device according to the invention comprises three distinct structures:
  the matrix emission structure 60 which comprises a plurality of electron beam emission sources 61,
  an electrode structure 7 comprising a plurality of diaphragm structure openings, and
  a hybridisation system 9-9' interposed between the matrix emission structure 6 and the electrode structure 7.

The invention allows to control, on the one hand, the dimensions of the openings 8, and, on the other hand, the spacing of the second diaphragm structure 7 relative to the first electron emission structure 6, which allows to control the divergence of each electron beam emerging from a diaphragm opening and provides the desired divergences. With a reasonable magnetic projection optic (corresponding to a uniform magnetic field of 0.3 teslas), divergence of a few degrees allows to foresee focussing of the beams in the form of localised spots of a resolution of nanometric order.

The electrode 70 drilled by diaphragm openings 8, which form the second structure 7 when it is placed in a non-zero anode field, has the effect of a lens. This effect must be controlled, since it can disrupt or participate in focussing as per the case.

It is provided for the majority of applications, that the complete device 5 in placed in an electric acceleration field, such a uniform electric field E able to be generated by the polarisation of the emitter matrix 60, of the hybridised electrode 70 and an anode 40 facing the electron emission device 50. Each opening 8 arranged in the hybridised electrode 70 thus has a focussing lens effect. According to an advantageous embodiment, the openings of the diaphragm 8 can have a bevelled profile, which limits the aberrations of the electronic beam at the edge of the openings and increases the resolution accessible with this device.

This is why the electronic emission device 50, according to the invention, integrates advantageously as an emission source in a high-resolution multibeam electronic system 5, such as that illustrated in FIG. 5, comprising a focussing system 4 and an acceleration anode 40 of the electron beams 59/49.

The invention provides a series of parallel electron beams 59 at the output of the electronic emission device 50, each beam exhibiting only one angle of divergence of about a fraction of a degree to a few degrees. By using a focussing system 4 (for example a magnetic projection system generating a magnetic field B of about a few hundred Tesla to several tens of Tesla), the invention provides nanometric resolutions.

The invention therefore advantageously enables:
  separate production of a first structure 6 comprising a matrix in one or two dimensions of emission sources for electron beams, and a second structure 7 comprising a matrix of diaphragm openings;
  transfer of the second structure 7 to the first structure 6;
  control of the spacing X between the second structure 7 and the first structure 6;
  control of alignment between the openings 8 of the second structure 7 and the emission sources 61 of the first structure 6; and,
  put into electrical contact certain conductive parts 60 of the first structure 6 and certain conductive parts 70 of the second structure 7.

Embodiments of the first electron emission structure, of the diaphragm electrode forming the second structure, the diaphragm openings and the hybridisation system will now be detailed herebelow.

Figure 6:
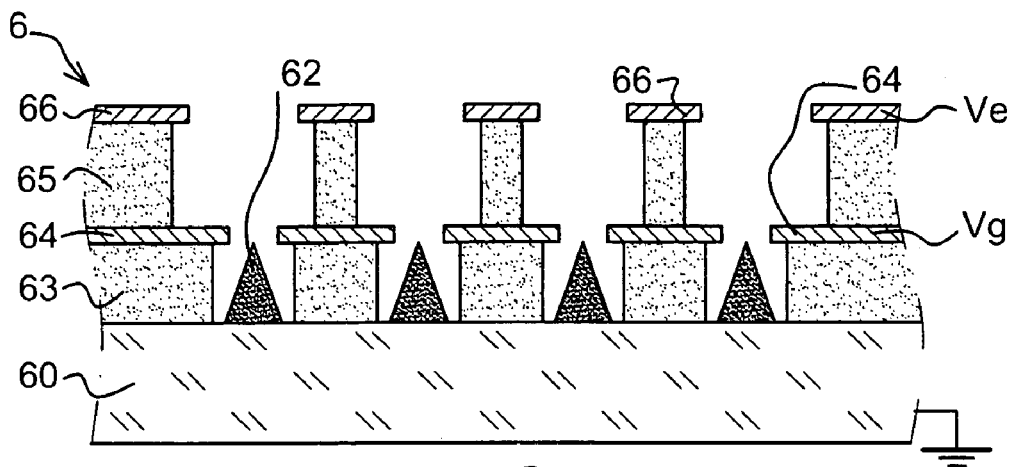
FIG. 6 illustrates in a detailed view an embodiment of the structure for emission of electron beams of the device, according to the invention.

FIG. 6 illustrates an embodiment of the structure for emission of electron beams used according to the invention.

As shown in FIG. 6, the electron emission source structure is integrated on a semiconductor substrate support 60, for example silicon, on which an integrated circuit such as a matrix addressing circuit for writing and programming the electron beams is implanted, capable of comprising logic gates or memories, created in CMOS technology (technology for implantation of a component on Complementary Metal Oxide Semiconductor).

The emitting electron sources 62 are implanted at the surface of the substrate 60 which is reconnected to ground. The emitters 62 can be constituted by metallic points or semiconductive points, nanometric tubes made of carbon fibres (<<carbon nanofibers>>), or even thin films made of carbon or porous silicon, for example. Several emitting points 62 can optionally be combined to make up a single electronic emission source 61. The emitting sources 62 can be implanted in a matrix network in one dimension or two dimensions, especially according to regular periodic arrangement in two dimensions, or a regular linear arrangement in one dimension, or a multilinear arrangement on several parallel axes in one dimension, or even according to an irregular arrangement. The emitting sources 62 are deposited in openings arranged in a dielectric layer 63 made of insulating material, for example an oxide layer. The thickness of the oxide layer 63 is of about a few tens to a few thousand nanometers. A metallisation surface 64 is deposited on the surface of the insulating layer 63 to form an extraction electrode polarised to a positive voltage Vg. Openings, typically circular, are arranged in the axis of the emitting sources 62 so as to form an annular grid around each emitting point 62 constituting a cathode. The opening of the annular grid can reach a dimension of about a few tens of micrometers to a few micrometers, according to the type of emitting source used.

According to the alternative embodiment illustrated in FIG. 6, the extraction electrode 64 is topped by another dielectric layer 65 and by another metallisation surface 66 forming a second electrode insulated electrically from the extraction electrode 64. This second electrode 66 is drilled by openings, typically circular, of dimensions generally greater than the extraction grid openings of the first electrode 64. The second electrode 64 is polarised to a voltage Ve, to form a first level of focussing lenses. The typical thickness of the conductive electrodes is of about a few hundreds of nanometers.

According to the invention, the diaphragm electrode 70 making up the second structure 7 is transferred by hybridisation 9 to the first emission structure 6 formed by the base plate substrate 60, on which the matricial arrangement of the emitting sources with field effect 61 is stacked out.

Hybridisation consists of transferring and assembling the second structure 70 to the first structure 60 by intercalating hybridisation means 9 and 9'.

According to the embodiment described earlier (FIG. 4), the hybridisation means 9 are formed by metallic balls 90. In a first embodiment, the hybridisation balls are composed of fusible metal alloys. The balls can be circular or oblong in shape, or in any other form, for example especially in the form of a mushroom.

The height X of the hybridisation balls 90 controls the spacing between the diaphragm electrode 70 forming the second structure 7 and the emission substrate 60 forming the first base structure 6. The hybridisation balls 90 preferably have micrometric dimensions, these microballs preferably having a size between one micrometer and several hundred micrometers. Such hybridisation means maintain a spacing distance X between the second structure 7 and the first structure 6 of between a fraction of a micrometer and a millimeter, according to the hybridisation means utilised.

Hybridisation techniques by fusible alloy ball further enable automatic alignment and control (to the nearest micrometer) of the diaphragm openings 8 of the second structure 7 relative to the emitting sources 61 of the first structure 6. It is the fusing of the balls which allows (via surface voltage forces) this auto-alignment between the structures 6 and 7. This technique thus especially enables auto-alignment between the emission means of electron beams and the divergence reduction means according to the invention.

In the case of hybridisation by gold balls, assembly is achieved not by fusion of the balls but by thermocompression. The assembly precision is ensured by the precision of the machines for aligning the structures to be assembled. These different hybridisation techniques are described for example in the article: <<Electronic production and test Advanced Packaging>>, pp. 32-34, April 1999.

FIGS. 9 to 9'C illustrate several hybridisation configurations at the interface between the second electrode diaphragm structure 70 and the first electronic emission base structure 60.

FIG. 9 shows a first embodiment in which the hybridisation balls 90 are arranged in the peripheral zones of the device between the edges of the second structure 7 and the edges of the first structure 6. Therefore, according to this embodiment, the hybridisation balls 90 are arranged outside the propagation zones of the electron beams and at the place where the diaphragm electrode 70 forming the second structure 7 can be thick enough to reinforce its mechanical performance.

FIG. 9' illustrates another embodiment in which several microhybridisation balls 90 are arranged, not only in the peripheral zones between the edge of the diaphragm electrode 7 and the edge of the substrate plate 60 forming the second electronic emission structure 6, but also in the central zone corresponding to the active part of the substrate 60 comprising the electron emission sources 61 and the central zone of the diaphragm electrode 70 which comprises the diaphragm openings 8. The microhybridisation balls 90 are arranged around each emission cell with field effect, and rise like columns in the intervals separating the propagation spaces from the parallel electron beams.

The function of the microhybridisation balls arranged in the central zone or active part of the device, alternatively or cumulatively, is to reinforce the behaviour of the mechanical assembly between the thin diaphragm electrode 70 (second structure) and the substrate plate 60 (first structure), and/or to put the electrical conductive parts of the diaphragm electrode 70 in contact with certain conductive parts of the substrate plate 60.

Such an arrangement applies particularly to making a device according to the invention comprising a diaphragm electrode 7 with reticulated or alveolar structure and comprising insulating partitions made or insulators separating conductive boxes in which the diaphragm openings 8 are arranged.

FIG. 9'A illustrates a first embodiment in which the hybridisation microballs 91 arranged in the central zone place parts of the substrate 60 are directly in contact with the conductive zones 70 surrounding the openings 80.

FIG. 9'B illustrates a variant embodiment in which the hybridisation microballs 92 of the central zone are supported on the electrode 64 of the extraction grid of the electrons deposited on a dielectric layer which separates it and insulates it from the substrate 60, in which the electron emitting sources 61 are arranged or implanted. Here, the hybridisation balls 92 electrically connect the zones of the diaphragm electrode 70 extending around the openings 80 with the electronic extraction electrode 64 which is subjected to a potential or extraction grid voltage Vg.

FIG. 9'C illustrates another variant embodiment in which hybridisation microballs 93 are supported on the focussing electrode 66 which is provided in certain embodiments of the first structure 6, for example that of FIG. 6, and which tops the electronic extraction grid electrode 64 deposited above the semiconductor substrate 60 in which the electron emitting sources 61 are stacked out.

In this embodiment, the hybridisation microballs arranged in the central part electrically connect the zones of the diaphragm electrode 70 surrounding the openings 80 with the focussing electrode 66 which is subjected to a potential or polarisation voltage Ve.

Figure 7A:
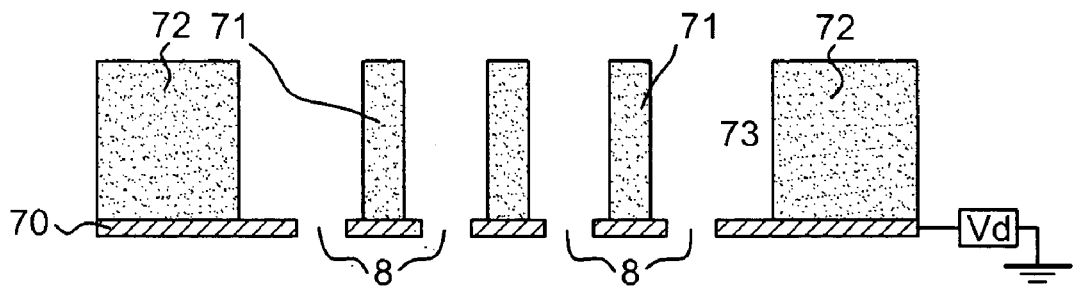
FIGS. 7A and 7B illustrate details of two embodiments of the electrode structure comprising diaphragm openings of the device, according to the invention.
Figure 7B:
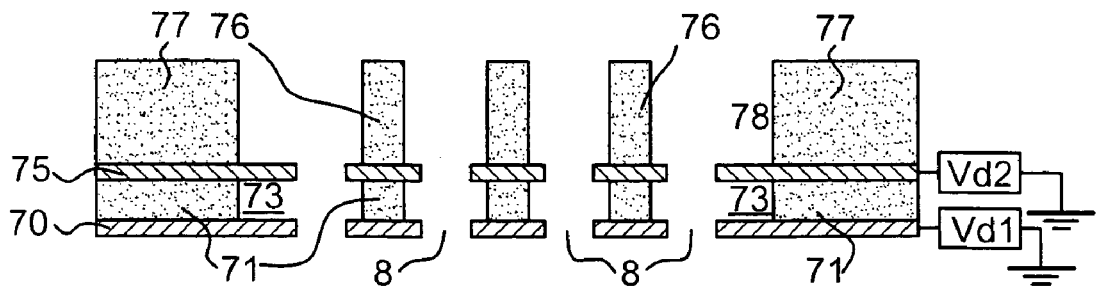

FIGS. 7A and 7B illustrate two embodiments of the second structure and show the general course of the hybridised electrode 70. The bevelled profiles of the diaphragm openings, detailed later, are not illustrated in FIGS. 7A and 7B.

FIG. 7A illustrates a first embodiment in which the second structure is composed by a conductive membrane 70 topped by an oversize 72 of the conductive material or the depositing thickness 72 of a layer of another material which equally can be conductive, semiconductive or dielectric. The thickness of the conductive diaphragm membrane 70 which intercepts the electron beams around the diaphragm openings 8, is of about a fraction of micrometers (for example 0.1 μm) to several hundreds of micrometers (e.g. 500 μm). Outside the zones surrounding the diaphragm openings 8, the thickness of the second structure can reach much more significant values, for example cumulative thicknesses of up to approximately one millimeter, especially on the edges and on the periphery of the second structure so as to improve the mechanical performance or resistance to deformation of thermal origin of the whole of the second structure 7A.

The conductive part 70 of the hybridised electrode 7A is subjected to a potential polarisation Vd to control the electric acceleration field of the electrons between the emission device and the anode and/or provide an electrostatic focussing effect, as specified herebelow.

FIG. 7B illustrates another embodiment more complex than the second structure 7B which here comprises two successive electrodes 70 and 75, for increasing the polarisation strategies of the structure 7B.

In the implementation in FIG. 7B, as in the example of FIG. 7A, the second structure 7B comprises a first conductive or semiconductive membrane 70 forming a first electrode drilled by diaphragm openings 8. The membrane is topped by a layer of dielectric material 71, of average thickness of about one micrometer, drilled by openings 73 in the corresponding emplacements to the right of the diaphragm openings 8, the recesses 73 preferably being of a size greater than the size of the diaphragm openings themselves. The thickness of the conductive part 70 can be reduced to a thickness of about a few tens of micrometers. The dielectric layer is topped by a conductive uniform membrane 75 which forms a second electrode. The thickness of the dielectric layer 71 electrically insulating the electrodes 70 and 75 from one another can range from one micron to tens of microns. The thickness of the conductive membrane 70 in the zones which intercept the electron beams, around the diaphragm openings 8, can range from about a tenth of a micrometer to several hundred micrometers (for example 500 µm). All the same, the second electrode 75 can be made excessively thick or can be topped by a layer 76-77 of another conductive, semiconductive or dielectric material, whereof the thickness can reach approximately one millimeter. These excess thicknesses, whether arranged in the actual body of the material of the second electrode 75, or in a different conductive or insulating material 77, are arranged outside the zones of diaphragm openings 8, especially on the peripheral edges of the electrode to improve the mechanical or thermal performance of the second structure 7B. Openings 78 are arranged in front of the diaphragm openings 8. According to the example of FIG. 7B, the openings 78 arranged in the oversizes of the second electrode have dimensions greater than the dimensions of the diaphragm openings 8 arranged in the second electrode 75 itself.

The diameter of the smallest diaphragm openings 8 arranged in the electrodes can reach a tenth of a micrometer to several tens of micrometers (for example 50 µm), while the greater dimension of the biggest diaphragm openings is not limited.

Each electrode 70, 75 formed by a conductive membrane is subjected to a respective polarisation potential to form an electrostatic acceleration field of the electrons of each side of the second structure and between the two electrodes 70, 75.

In the embodiments of FIGS. 7A and 7B, each electrode 70 or 75 is subjected to a potential Vd, Vd1 or Vd2 uniform over the entire surface of each electrode 70 or 75. All the diaphragm openings 8 of each electrode 70 or 75 are thus subjected to the same electrical potentials.

Alternatively, according to another embodiment not illustrated, it is provided that the openings can be subjected respectively to distinct individual potentials. The second structure can thus be implanted in a substrate or a material having an alveolar or reticulated structure, comprising silicon boxes separated by bands of insulates, especially using bricks according to technology known as SIBOX. In this type of technological material, each semiconductive box is insulated electrically from the other adjacent semiconductive boxes. The second structure 7 is implanted in this substrate or this technological material, each individual insulated box then being drilled by one or more diaphragm openings 8. The opening or the group of openings belonging to a box can be subjected individually to a respective potential, in order to focus each electron beam which passes through these diaphragm openings either individually or in groups.

An advantage of this embodiment is to control the divergence and the optical quality of the transmitted beams.

Figure 8A:
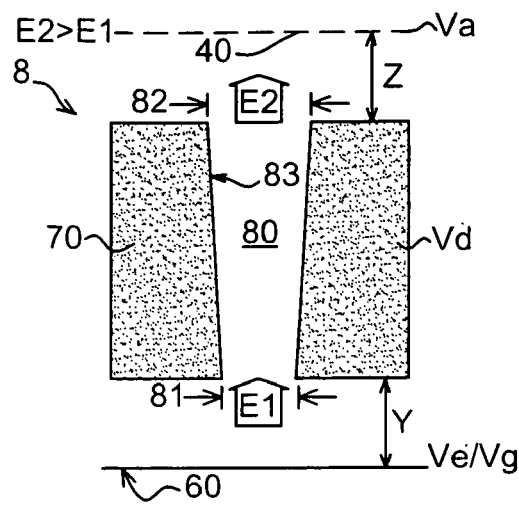
FIGS. 8A, 8B and 8C illustrate details of embodiments of the diaphragm openings of the device, according to the invention.
Figure 8B:
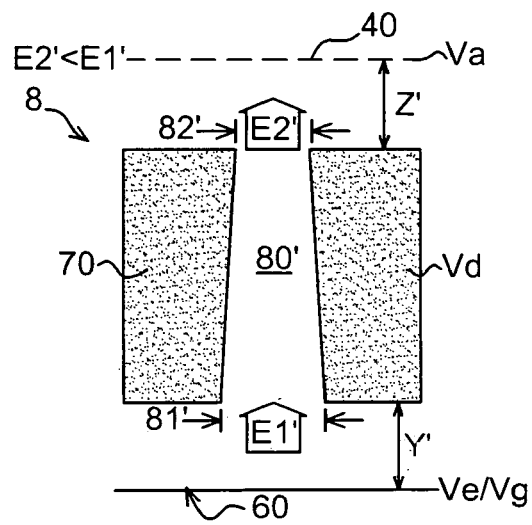
Figure 8C:
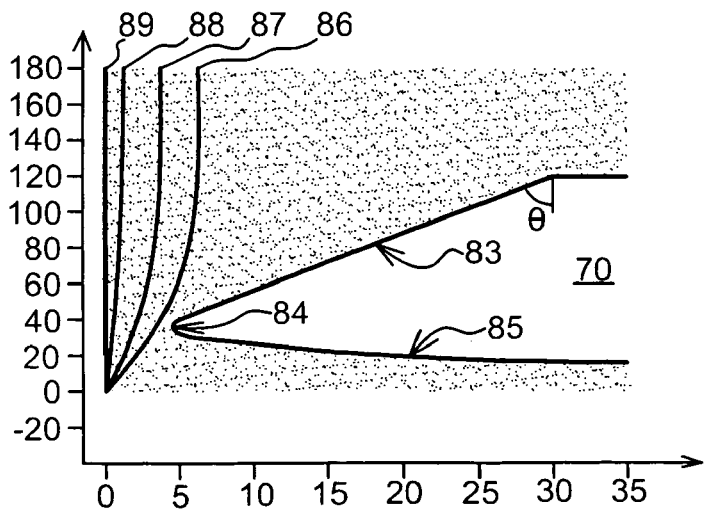

FIG. 8C is a diagram representing the course of the paths of the electrons originating from a localised emission source through a diaphragm opening 70 with bevelled profile. As it can be seen in the lower angle of FIG. 8C, the first effect of the diaphragm opening is to limit the angular opening of the electron beam transmitted through the second diaphragm structure 70. For example, with a diaphragm opening of 5 micrometers in size, arranged at a distance of 20 micrometers from the localised emitting source, the narrowest part of the diaphragm opening 84 limits the angular opening of the beam to +/−4 degrees of angle.

In the example of FIG. 8C, the electric field is zero (E1=0) between the emitting source situated at the origin and the first side 85 of the diaphragm structure 70. On the other side of the second structure 70, a uniform electric field of about 1 volt/micrometer (E2=$10^6$ V/m) is imposed by an anode (not illustrated) which faces the electrode 70 formed by the second structure. All the trajectories of electrons are subjected to a uniform magnetic field of about a few tens of Tesla (for example 0.3 T). It is observed that the trajectories of the electrons 86, 87, 88, 89 curve and fold back towards the propagation axis 89 under the effect of electrostatic acceleration and magnetic focussing. The bevelled opening profile 80 limits the aberrations of the electronic beam to the crossing of the diaphragm 70, along the opening edge 83. The diaphragm effect is realised in the part of the second diaphragm structure 70 where the opening is the most reduced 84. Such a disposition provides excellent quality of the electronic beam. The beveling of the upper part 83 of the diaphragm reaches a resolution less than 10 nm and divides by five the spot dimensions (focal point) obtained with the device according to the invention, relative to those diaphragm openings without beveling, which is the consequence of the reduction in aberrations at the crossing of the diaphragm 70. In an advantageous manner the beveling of the diaphragm openings of the device according to the invention quintuples the resolution of the point of focus of an electronic beam.

In addition, the invention provides that the electric field E is not uniform when crossing of the diaphragm, each side of the diaphragm electrode being exposed to electric fields E1, E2 of different values.

According to the invention, the orientation of the opening of the bevel 83 preferably depends on the orientation of the gradient of electric field at the crossing of the diaphragm 70. It is provided that the narrowest part 81 or 84 of the diaphragm opening 80 faces an electric field less important than the widest part 82 or 83 of the diaphragm opening 80. The orientation of the bevel 83 of the opening 80 thus depends on the polarisation of the electrode 70 vis-à-vis the electronic emission device 60 and vis-à-vis the accelerating or focussing anode 40, for example.

FIG. 8A illustrates a first embodiment in which the openings 80 70 of the diaphragm form bevels 83 opening in the direction of propagation of the electronic beams, and are subjected to a gradient of electric field E1/E2 growing in the direction of propagation of the electrons. The bevel 83 of the opening 80 is oriented such that the first side of the diaphragm 70 presenting the narrowest opening 81, or presenting the lower opening section 81, is exposed to an electric field E1 having a first value less than a second electric field value E2 which bathes the other side 82 of the diaphragm 70. The second side of the opening 80 which has a width of opening 82 greater than the first opening 81, or at least an opening section having an area 82 greater than the area of opening 81 of the first side, is exposed to a second electric field value E2 greater than the first electric field value E1 which faces the first side 81 of the diaphragm 70.

In particular, the electric field can be absent, that is, of a substantially zero value (E1≅0) between the diaphragm and the emission device. This particular case corresponds to the case where the electrode of the diaphragm structure 70 is polarised to the same potential electrical as the emission device 50 (Vd=Vg or Vd=Ve or Vd1=Vg or Vd1=Ve).

In the case of FIG. 8A, after having been diaphragmed at the place where the diaphragm opening 80 is the narrowest 81, the electron beams are secondly focussed or accelerated by the strong electric field E2 on the place where the opening 80 is the widest 82. Strong electrostatic effects occur in this zone, but as the trajectories of the electron beams transmitted at this level pass further away from the end opening edges, the trajectories undergo fewer aberrations.

The device according to the invention comprises means for applying polarisation potentials or electrical voltages to each of the abovementioned electrodes.

FIG. 8B discloses another embodiment in which, this time, the electron beams are exposed to a gradient of electric field decreasing in their direction of propagation, as they cross the openings 80' of the diaphragms 70.

In this case, as illustrated in the realisation in FIG. 5B according to the invention, the openings with bevelled profile are preferably oriented such that each diaphragm opening 80' shrinks in the direction of propagation of the electron beams. In this case, the bevelled diaphragm openings 80' are oriented such that the opening of greater width 81' is arranged on the first side facing the electron emitting sources, and are exposed to an electric field of value E1' greater than the electric field value E2' which bathes the second side of the diaphragm 70. The second side of the diaphragm comprises openings 82' presenting a narrower width or a section of opening 82' of lesser area, these narrow openings 82' facing the accelerating or focussing anode 40.

In the case of FIG. 8B, the electron beams are exposed to a decreasing gradient of electric field E1'/E2' in their direction of propagation and are first focussed or accelerated by the strong electric field E1' at the place where the opening 80' is the widest 81', prior to being diaphragmed at the place where the diaphragm opening 80' is the narrowest 82', which proves to be the place where the electric field value E2' is the lowest, even zero. The electric field can in fact optionally be absent from the second side of the diaphragm 70, which corresponds for example to a case where the anode is polarised at the same potential as the diaphragm 70.

In an advantageous manner according to the invention, the diaphragm effect is achieved on the side of the diaphragm where the electric field E2 is the weakest, which corresponds to the narrowest side of openings 82'. The trajectories of the electron beams which pass near the edge of the opening thus undergo few aberrations.

It is noted that, due to the invention, the greater the angle of bevel of the openings, the more the preceding effects are marked and the fewer aberrations are created at the crossing of the diaphragm. The value of the angle of the bevel of the openings is limited only by the emitter density at the surface of the device.

FIG. 8C shows a bevelled diaphragm opening profile with a strong angle of inclination θ of around 15° relative to the axis of propagation of the electrons. In other embodiments, not illustrated here, the diaphragm openings can be bevelled with a non-linear profile, that is, the bevel is not rigorously flat, but may be convex or concave, for example.

Such opening profiles are also favourable for reduction of aberrations when the electron beam passes through the diaphragm.

The embodiment of an electronic emission device according to the invention can be the object of several embodiments and variants of the base architecture with even steps, in particular of a matricial arrangement in two dimensions, a linear arrangement in one dimension or a multilinear arrangement in two dimensions, with even or uneven steps.

FIG. 10 illustrates a general view of an achievement of matricial architecture in two regular dimension with even steps, comprising a network of emitting sources 6 and diaphragm openings 8 7 arranged according to a regular grid.

FIG. 11 illustrates a general view of a realisation of an electronic emission device according to the invention, comprising an emission structure 6 comprising a single row of sources and a diaphragm structure 7 comprising a row of corresponding openings 8 arranged in linear rods according to a periodic arrangement in one dimension at even steps. Alternatively, the emitting sources and the diaphragm openings 8 can be arranged at uneven intervals.

FIG. 12 illustrates a general view of another achievement of an electronic emission device according to the invention, in which the first structure 6 and the second structure 7 comprise several relatively spaced parallel rows of emitting sources and diaphragm openings 8 arranged in two dimensions at even periodic intervals. Alternatively, the emitting sources and the diaphragm openings 8 can be arranged at uneven intervals.

The spacing of the emitting sources and the corresponding openings 8 can vary from about one micrometer to a hundred micrometers, the matricial interval typically being a few micrometers or a few tens of micrometers, for example around fifty micrometers. Such a structure integrates particularly advantageously into a high-resolution multibeam electronic emission system, according to the diagram of FIG. 5B which further comprises a focussing optic 57 and an electrostatic acceleration anode. At the output of the diaphragm openings of the emission device 50, the angular opening of the beams is reduced to a few degrees, even on this side of the degree due to the invention. The focussing optic 57 is preferably a magnetic projection optic generating a magnetic field of about few hundred Tesla to a few Tesla, typically a few tens of Tesla. Advantageously, such a device according to the invention provides electron spots having a resolution of nanometric order.

FIGS. 13A to 16B show another embodiment in which the diaphragm also forms collection means on the one hand of the current emitted by the emitter means so as to collect part of the emitted current, and is attached to measuring means of this part of emitted current, said measuring means being connected to polarisation means of the electron emitter means.

Figure 13A:
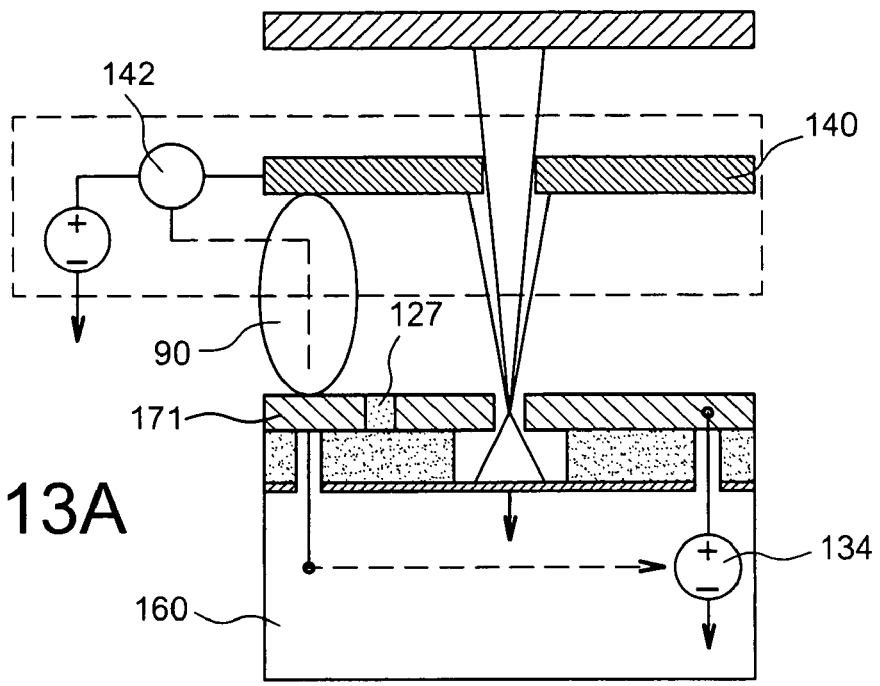
Figure 13B:
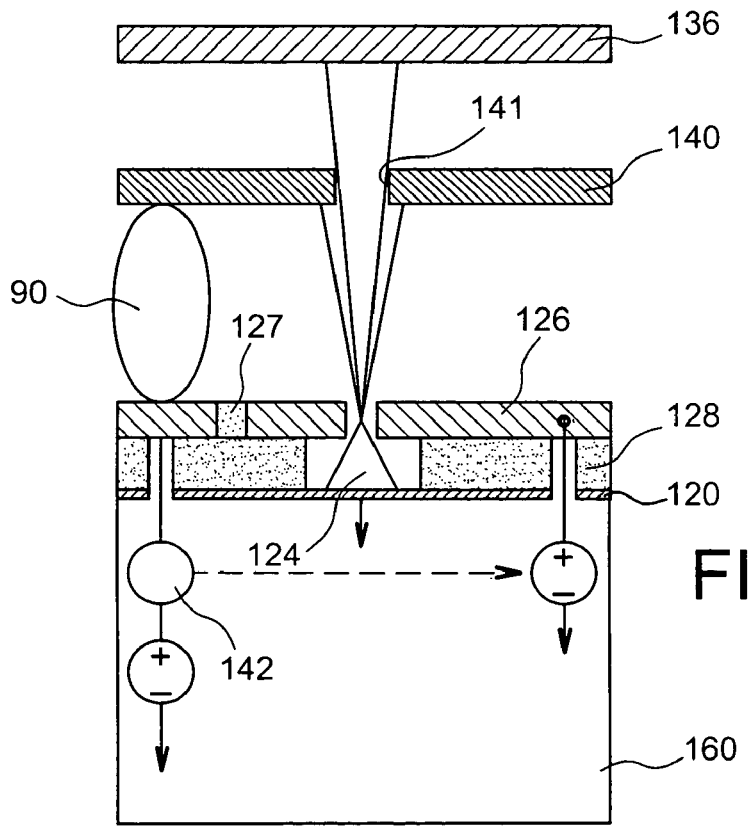

According to the embodiment illustrated in FIGS. 13A and 13B, the electron emitter means comprise a cathode 120, electron micro-emitters 124 (point or nanotube) and a first extraction grid 126, the extraction grid-cathode distance being regulated by the thickness of a dielectric 128, which is for example of about one micrometer. Polarisation means 134 polarise respectively the extraction grid and the cathode and thus control the current emitted by the micro-emitters.

The inventive device also comprises collection means 140, for example comprising an electrode or a collection grid, and can be positioned above the emission site. They are connected to means 142 for measuring the current.

Figure 15A:
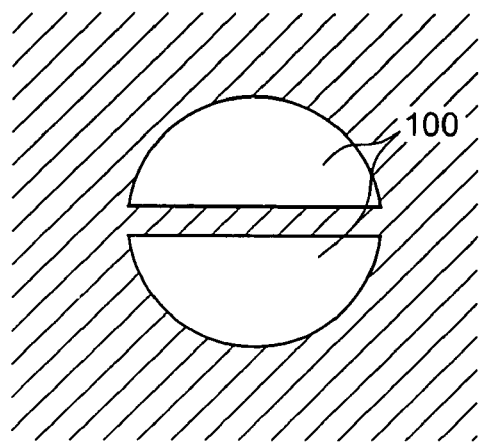
Figure 15B:
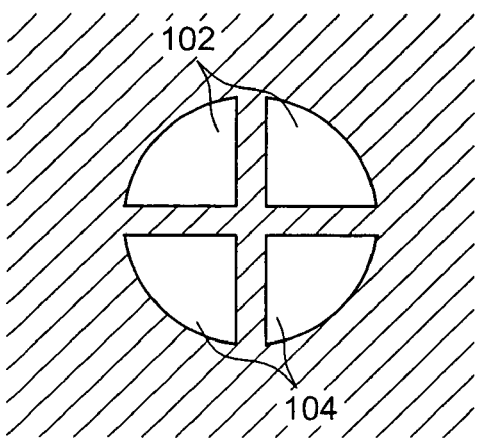

These collection means are thus placed on the trajectory of the electrons emitted so as to take part thereof and to allow passage of the rest of the electrons emitted to the anode. For this, orifices (or openings) are provided on these collection means. These orifices can be circular, oval or rectangular, and they can also exhibit other advantageous geometries. As illustrated in FIGS. 15A and 15B, they can also have the form of circular sectors 100, 102, 104 or even the form illustrated in FIG. 15C (scalloped circle).

As a function of the selected geometry and applied polarisation, and according to standard laws of optics and electromagnetics, the part of the collected electrons and that of the electrons effectively transmitted to the anode can be determined. Therefore, measuring the collected current will give a precise indication of the electrons arriving at the anode (and thus of the dose emitted).

Figure 15C:
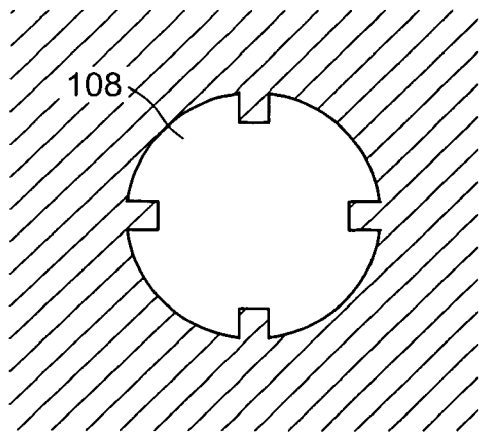

Relative to a circular orifice, these orifices cut out of FIGS. 15A to 15C enable the collection of electrons at several levels of electronic beam and not just at the edges of the beam, thus allowing them to be less sensitive to the inhomogeneities which can appear on the edges. As a function of the application envisaged these orifices typically have diameters of about a few microns to a few tens of microns.

The current collection means 140 are positioned in the emission axis, the distance relative to the first extraction grid 126 being adjusted by hybridisation means 90, for example a micro-ball 90 or any other means of interconnection (pillar, . . . ). In fact, the grid or the collection means are connected by the means 90 to a conductive zone 171, located in the standard emission device at the level of the extraction grid but insulated in this extraction grid by the insulating zone 127 (for example $SiO_2$). The hybridisation means 90 retain a clearance between these elements which, combined with the insulating zone 127, ensures the insulating effect between them.

The height of these hybridisation balls 90 controls the spacing between the electrode 140 and the substrate which comprises the emission means 124.

Such hybridisation means retain a fairly precise clearance distance between the means 140 and the emission grid 126, typically of about a few hundred microns and with precision of about a fraction of microns.

By placing the current-measuring means 142 (amperemeter) in the feed circuit of the collection means, it is possible to measure the electronic beam, or a magnitude proportional to the anode current, and interact on the current of the micro-emitter, or via the extraction grid 126 control and/or via the cathode 120 control. Adjustment can be done by way of counter-reaction means. These counter-reaction means can for example be made up of a voltage current converter connected to an amplification module and to an inverter, if needed. They therefore establish the voltage to be applied to the cathode and/or the extraction grid from the current collected at the collection grid. The invention thus makes use of the control and anode current regulation means separate from the extraction grid.

The grids 126 are metallic in type. More generally, they are conductive (for example made of polycrystalline silicon).

The emitting points 124 are conductive, for example made of silicon or molybdenum.

The extraction grid 126 is for example a few hundred nm to a few micrometers thick.

The thickness of the dielectric 128 is typically of a few hundred nm (for example between 0.4 and 0.7 μm).

The distance between the substrate 120 and the anode 136 is around 1 mm for the application envisaged. It can vary from 10 μm to 10 mm according to the application.

A first voltage generator 134 creates for example a positive ddp between the first extraction grid 126 and the cathode 120 to allow the electrons to escape from the point into the vacuum. The electron beam is oriented to the anode 136 with a certain angular opening. To collect electrons, the anode 136 is for example brought to a few hundred volts positively. The means 140 collect electrons, converted by the means 142 to current, information which the counter-reaction means can utilise to adjust the extraction of electrons as a function of a threshold value of the current emitted, for example.

The operating frequencies of the source are preferably in the field of high frequencies, outside 1 Mhz.

The physical realisation of micro-sources known according to the prior art imposes non-ideal structures. Interfering capacitors, between the point 124 and the grid 140, especially cause substantial displacement currents, at the moment of switching.

In the embodiment illustrated in FIGS. 13A and 13B, it is conceivable to connect the extraction grids 126 and collection grids 140 to current control blocks and grid control located in the CMOS substrate, by electrical crossings. These processing blocks utilise mixed LV/HV technology (low voltage/high voltage), the control and command executed in LVCMOS and emission control in HVCMOS. A collective manufacturing process can align the collection grid 140 on the emitting point 124.

As illustrated in FIG. 13A, a silicon wafer can be utilised as a substrate for making the collection grid. This substrate will also be used to create, at the same level as the collection grid, the current-measuring means and associated processing means. This can be referred to as an <<active>> collection grid.

An advantage of this variant is increasing the available surface for making electronic processing blocks and above all to differentiate the low-voltage analog part at the silicon substrate from the collection grid 140, and the high-voltage analog commutation part 134 at the silicon base substrate 160; inter alia this limits the problems of interference between these two parts and furthermore permits the use of two substrates of totally different technologies.

In the device illustrated in FIG. 13B, it is a <<passive>> collection grid, where the current-measuring means 142 and the processing of the collected current are localised in the CMOS substrate 160.

Figure 16A:
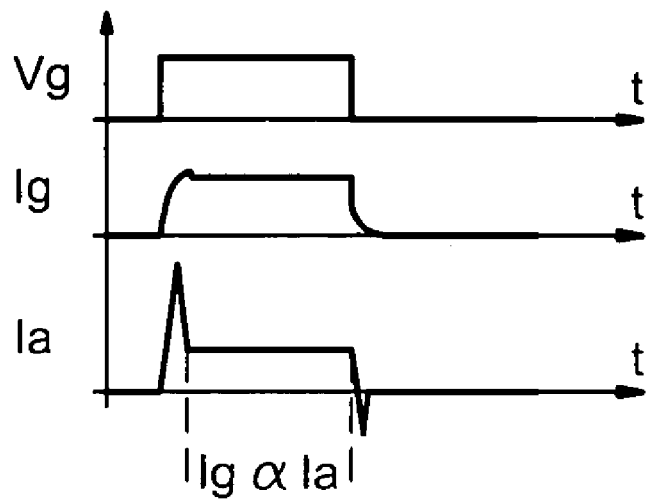

In an embodiment, control is executed by the extraction grid, the cathode potential is maintained at a constant voltage, the potential of the extraction grid is pulsed between a high level and a low level (see the voltage Vg on the chronogram of FIG. 16A). The high level corresponds to a period during which the micro-emitter emits, the low level corresponds to a period during which the micro-emitter does not emit (see the anode current Ia in FIG. 16A).

According to the invention it is possible, from the current Ig collected at the collection grid (proportional to the anode current in its central part), to act on the potential of the extraction grid to modulate emission from the micro-emitter. For this, either the level high of the voltage Vg can be modulated, or the emission duration can be modified by playing on the duration of this high level.

Significant, peaks in current, transitionally at the level of the current of the collection grid, can be noticed in FIG. 16A at the moment of switching of the potential of the extraction grid. It can thus be of interest to defer measuring the collection current so as to avoid the perturbations associated with these commutations.

In another embodiment, control of the micro-emitter is regulated by the cathode. The potential of the extraction grid is thus constant, whereas the cathode potential is pulsed between a high level and a low level, the latter level corresponding to the emission period of the micro-emitter.

According to the invention, from the collected current Ig the potential of the cathode (Vcathode) can be acted on to modulate emission of the micro-emitter. The low level of the cathode voltage can be modulated in amplitude or in duration.

Figure 16B:
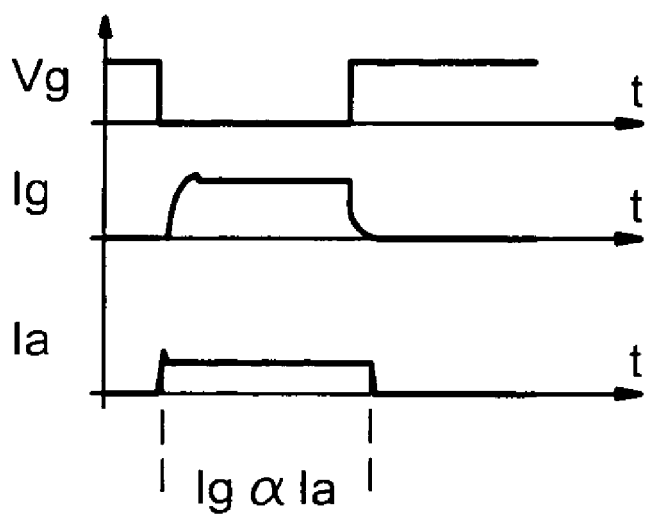

It can be noted from FIG. 16B that the current collected in case where control of the microemitter is regulated by the cathode, is less sensitive to the commutations of the cathode voltage than in the preceding case.

Figure 14A:
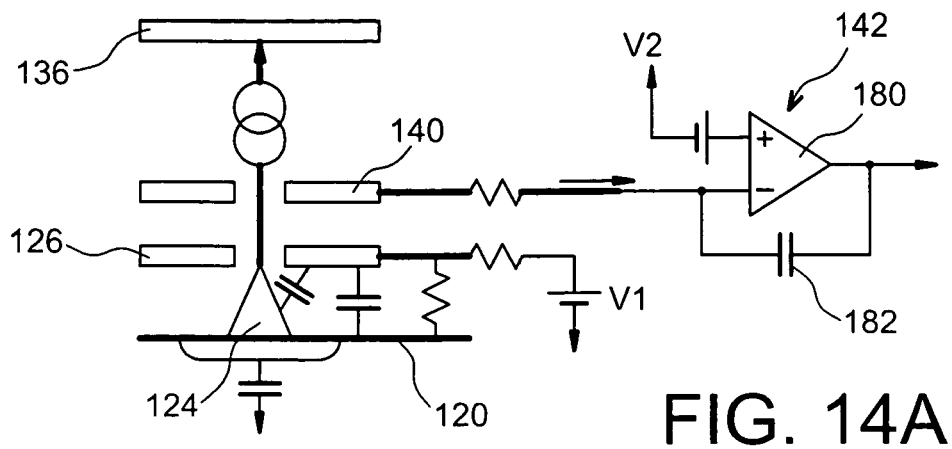

The example of FIG. 14A illustrates the current-measuring means of a measuring signal amplified by an amplifier 180 on which a condenser 182 is mounted in counter reaction. It is possible to convert the current voltage measure, a variable more easily exploitable with a limited number of components (CTIA). The variation in output voltage is thus expressed by:

$$\Delta V_{s(G)} = \frac{-Igate * T}{Cfb}$$

where T illustrates the current integration time, or the analysis time. This structure is fairly insensitive to the rapid variations in current. The value of the condenser 182 is for example of about 10 fF, which results in sensitivities of about 20 μV/electron.

Figure 14B:
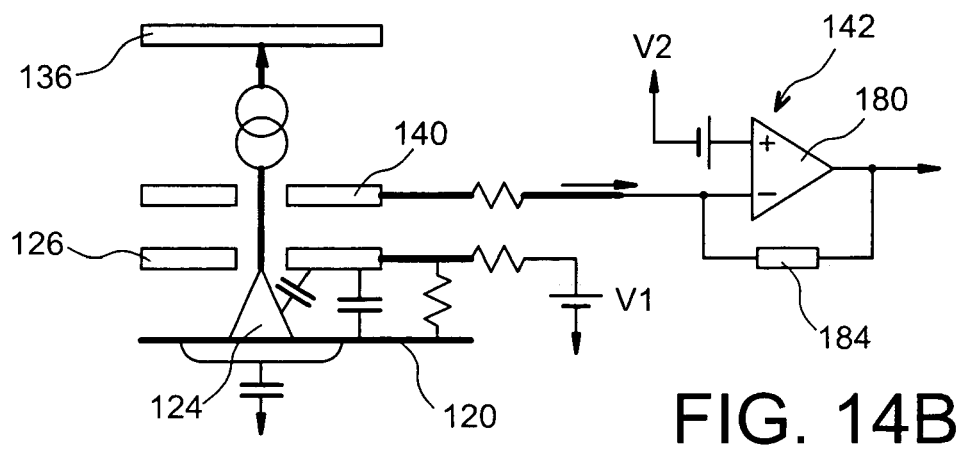

The structure illustrated in FIG. 14B, with a counter-reaction resistor 184, represents instantaneous variations in output voltage on instantaneous variations of the input current. The variation in output voltage is in this case expressed as:

$$\Delta Vs = -R \cdot Igate$$

Figure 14C:
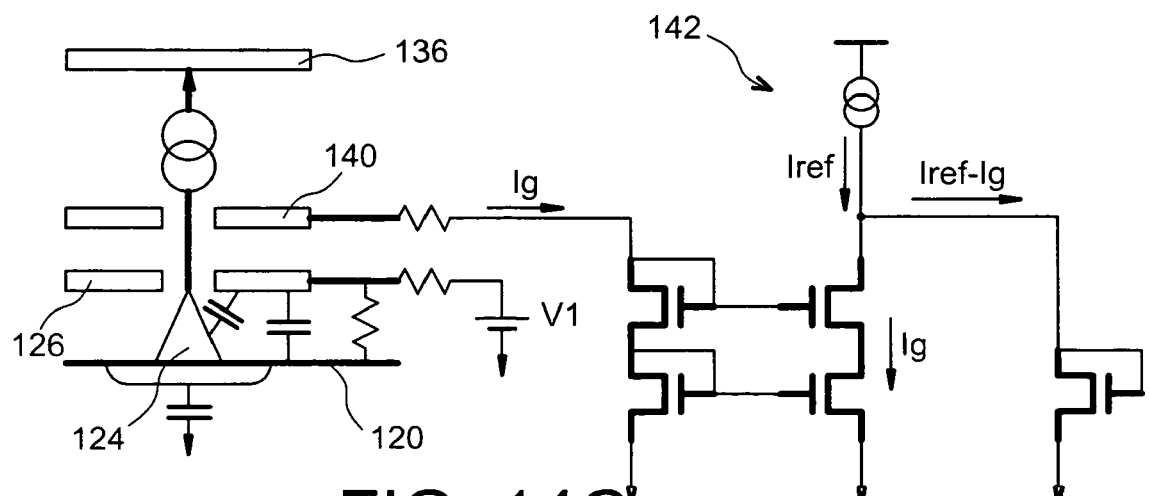

Finally, FIG. 14C illustrates a measuring setup by current mirror: an image of the current of collection grid Ig can be used to generate a current of difference Iref–Ig, which can be utilised.

A device according to the invention, irrespective of the embodiment envisaged, is able to compensate technological spatial non-uniformities or non-uniformities of known electron sources.

Other arrangement forms, variants and embodiments will be able to be utilised by the specialist, without departing from the scope of the present invention.

The invention claimed is:

1. An electronic emission device including plural electron beams comprising:
   a first structure including a plurality of emitting sources of electron beams;
   a second structure including a plurality of diaphragm openings; and
   metallic balls made from at least one of fusible metal alloys and gold interposed between the first structure and the second structure and hybridizing the first structure with the second structure.

2. The device according to claim 1, in which the second structure includes an electrode or a metallic or conductive or semiconductive membrane.

3. The device according to claim 1, in which at least one diaphragm opening has two different opposite opening surfaces, the opening surface of a first side of the diaphragm having an area greater than an area of the opening surface of a second side of the diaphragm.

4. The device according to claims 1, in which each diaphragm opening comprises a bevelled, flat, concave, or convex opening edge profile.

5. The device according to claim 1, in which each of the first structure and the second structure comprises a periodic arrangement of sources of emission of electrons or diaphragm openings, the structures having a matrix arrangement or a multilinear arrangement or a linear arrangement, regular or irregular.

6. The device according to claim 1, in which the sources of electron beam emission and the diaphragm openings are arranged with a spacing of about a few microns to one millimeter.

7. The device according to claim 1, further comprising electrostatic or magnetic or electromagnetic means for focusing electron beams.

8. The device according to claim 1, further comprising means for magnetic projection.

9. The device according to claim 1, further comprising a polarized anode or electrode structure arranged outside the second structure of diaphragm openings.

10. The device according to claim 1, in which the second structure comprises at least one conductive part and at least one dielectric part.

11. The device according to claim 1, in which the second structure comprises two levels of electrodes or membranes, which are metallic, conductive, and attached to at least one dielectric layer.

12. The device according to claim 1, in which the second structure includes, around zones of the diaphragm openings, a thickness of about a fraction of a micrometer to a few hundred micrometers.

13. The device according to claim 1, in which the second structure includes, outside zones of the diaphragm openings, a thickness of about one micrometer to around one millimeter.

14. The device according to claim 1, in which the second structure includes an alveolar structure insulating each opening or plural groups of openings from one another, such that each opening or each group of openings is subjected to a respective polarization potential.

15. The device according to claim 1, in which at least one side of the diaphragm of the second structure is disposed in an electric field for acceleration or focusing of electrons.

16. The device according to claim 1, in which the second structure of diaphragm opening comprises two opposite sides, a first side facing an electric field, and a second side facing another electric field.

17. The device according to claim 1, in which at least one diaphragm opening has two different opposite opening surfaces, the opening surface of a first side of the diaphragm having an area greater than an area of the opening surface of the second side of the diaphragm, at least one side of the diaphragm of the second structure is disposed in an electric field for acceleration or focusing of electrons, the diaphragm openings are oriented such that the opening surface of greater area faces the electric field of greater value, and the opening surface of lesser area facing the electric field of less value or in absence of an electric field.

18. The device according to claim 1, in which each diaphragm opening comprises a bevelled, flat, concave, or convex opening edge profile, at least one side of the diaphragm of the second structure is disposed in an electric field for acceleration or focusing of electrons, the diaphragm openings are oriented such that the opening surface of greater area faces the electric field of greater value, and the opening surface of lesser area facing the electric field of less value or in absence of an electric field.

19. The device according to claim 1, in which at least one diaphragm opening has two different opposite opening surfaces, the opening surface of a first side of the diaphragm having an area greater than an area of the opening surface of a second side of the diaphragm, in which the second structure of diaphragm opening comprises two opposite sides, a first side facing an electric field, a second side facing another electric field, the diaphragm openings are oriented such that the opening surface of greater area faces the electric field of greater value, and the opening surface of lesser area facing the electric field of less value or in absence of an electric field.

20. The device according to claim 1, in which each diaphragm opening comprises a bevelled, flat, concave, or convex opening edge profile in which the second structure of diaphragm opening comprises two opposite sides, a first side facing an electric field, a second side facing another electric field, the diaphragm openings are oriented such that the opening surface of greater area faces the electric field of greater value, and the opening surface of lesser area facing the electric field of less value or in absence of an electric field.

21. The device according to claim 1, wherein the second structure is disposed completely above the emitting sources of the electron beams, and the second structure controls divergence of the electron beams.

* * * * *